United States Patent
Ji et al.

(10) Patent No.: US 12,532,744 B2
(45) Date of Patent: Jan. 20, 2026

(54) PACKAGING MODULE INCLUDING ELECTROMAGNETIC SHIELDING STRUCTURE HAVING CONDUCTIVE PILLARS AND CONDUCTIVE ADHESIVE, AND PACKAGING METHOD THEREFOR

(71) Applicant: HUAWEI TECHNOLOGIES CO., LTD., Guangdong (CN)

(72) Inventors: Zhongli Ji, Shenzhen (CN); Xulei Liu, Dongguan (CN); Fengtian Hu, Shenzhen (CN); Hongwu Zhang, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 411 days.

(21) Appl. No.: 18/161,227

(22) Filed: Jan. 30, 2023

(65) Prior Publication Data

US 2023/0178496 A1 Jun. 8, 2023

Related U.S. Application Data

(63) Continuation of application No. PCT/CN2021/107095, filed on Jul. 19, 2021.

(30) Foreign Application Priority Data

Jul. 31, 2020 (CN) .......................... 202010757065.6

(51) Int. Cl.
*H01L 23/552* (2006.01)
*H01L 21/768* (2006.01)
(Continued)

(52) U.S. Cl.
CPC ...... *H01L 23/552* (2013.01); *H01L 21/76837* (2013.01); *H01L 23/3121* (2013.01); *H05K 1/181* (2013.01)

(58) Field of Classification Search
CPC ............... H01L 23/552; H01L 23/3121; H01L 21/76837; H01L 23/24; H01L 23/04; H05K 1/181
See application file for complete search history.

(56) References Cited

U.S. PATENT DOCUMENTS

| | | | |
|---|---|---|---|
| 7,198,987 | B1 | 4/2007 | Warren et al. |
| 2012/0025356 | A1 | 2/2012 | Liao et al. |

(Continued)

FOREIGN PATENT DOCUMENTS

| | | |
|---|---|---|
| CN | 104347533 A | 2/2015 |
| CN | 105720016 A | 6/2016 |

(Continued)

OTHER PUBLICATIONS

Wikipedia, "Apple S1",Nov. 1, 20211, 2021,total:2pages.

(Continued)

*Primary Examiner* — Changhyun Yi

(57) ABSTRACT

The technology of this application relates to a packaging module and a packaging method therefor, and an electronic device. The packaging module includes at least two device groups and a shielding structure configured to shield the at least two device groups. The shielding structure includes a partition structure configured to perform electromagnetic isolation between every two adjacent device groups. The partition structure includes a plurality of conductive pillars and conductive adhesive, and a conductivity of the conductive pillar is greater than a conductivity of the conductive adhesive. The plurality of conductive pillars are arranged at intervals and are electrically connected to a ground layer of a substrate, the conductive adhesive fills a gap between any adjacent conductive pillars, and any adjacent conductive pillars are electrically connected by using the conductive adhesive.

20 Claims, 10 Drawing Sheets

(51) Int. Cl.
*H01L 23/31* (2006.01)
*H05K 1/18* (2006.01)

(56) References Cited

U.S. PATENT DOCUMENTS

| | | |
|---|---|---|
| 2015/0271959 A1 | 9/2015 | Chen et al. |
| 2016/0093576 A1 | 3/2016 | Chiu et al. |
| 2017/0162516 A1 | 6/2017 | Joh |
| 2018/0033764 A1 | 2/2018 | Huang et al. |
| 2019/0115305 A1* | 4/2019 | Lin, Jr. ............... H01L 25/0655 |

FOREIGN PATENT DOCUMENTS

| | | |
|---|---|---|
| CN | 106449602 A | 2/2017 |
| CN | 104659022 B | 9/2017 |
| CN | 107535081 A | 1/2018 |
| CN | 109671699 A | 4/2019 |
| CN | 110610906 A | 12/2019 |
| CN | 110707072 A | 1/2020 |
| CN | 111244067 A | 6/2020 |
| EP | 3678175 A1 | 7/2020 |
| JP | 2011035058 A | 2/2011 |
| JP | 2019179850 A | 10/2019 |
| KR | 20190129650 A | 11/2019 |
| TW | 202021079 A | 6/2020 |
| TW | 202228264 A | 7/2022 |
| WO | 2018181708 A1 | 10/2018 |

OTHER PUBLICATIONS

Wikipedia, "Apple silicon", This page was last edited on Apr. 5, 2023,total:28pages.
Office Action and Search Report dated Jul. 13, 2022 issued for TW Application No. 110127858 (10 pages).
International Search Report dated Oct. 15, 2021 issued for International Application No. PCT/CN2021/107095 (10 pages).
Office Action for Japanese Application No. 2023-506142 dated Apr. 2, 2024, 6 pages.
Office Action for Chinese Application No. 202010757065.6 dated Jul. 4, 2024, 8 pages.
European Search Report for EP Application No. 21851432.1 dated Dec. 8, 2023, 14 pages.

* cited by examiner

PACKAGING MODULE INCLUDING ELECTROMAGNETIC SHIELDING STRUCTURE HAVING CONDUCTIVE PILLARS AND CONDUCTIVE ADHESIVE, AND PACKAGING METHOD THEREFOR

CROSS-REFERENCE TO RELATED APPLICATIONS

This application is a continuation of International Application No. PCT/CN2021/107095, filed on Jul. 19, 2021, which claims priority to Chinese Patent Application No. 202010757065.6, filed on Jul. 31, 2020. The disclosures of the aforementioned applications are hereby incorporated by reference in their entireties.

TECHNICAL FIELD

This application relates to the field of electronic technologies, and in particular, to a packaging module and a packaging method therefor, and an electronic device.

BACKGROUND

As internal modules of an electronic device such as a mobile phone or a smartwatch become more compact, a distance between components in the electronic device becomes smaller. As a result, the components in the electronic device are susceptible to electromagnetic interference from other adjacent components. For example, a mobile hotspot (e.g., Wi-Fi) transceiver and a Bluetooth transceiver in the electronic device are often disposed adjacent to each other. An interference signal generated when the Wi-Fi transceiver works will interfere with work of the Bluetooth transceiver. Similarly, an interference signal generated when the Bluetooth transceiver works will also interfere with work of the Wi-Fi transceiver To reduce electromagnetic interference between adjacent components and reduce a space occupied by modules for electromagnetic shielding in the electronic device, a system in a package (SIP) is expected to become a mainstream electromagnetic shielding solution. The Wi-Fi transceiver and the Bluetooth transceiver are used as an example. As shown in FIG. 1, in a current system in a package, a Wi-Fi transceiver 3 and a Bluetooth transceiver 2 are disposed on a same surface of a substrate 1, a metal layer 4 is disposed on an outer surface of the system in a package, and the metal layer 4 and the substrate 1 form a space accommodating the Wi-Fi transceiver 3 and the Bluetooth transceiver 2. In addition, a metal partition structure 5 is further disposed between the Wi-Fi transceiver 3 and the Bluetooth transceiver 2, and the metal partition structure 5 can divide the space into two independent subspaces. One subspace can accommodate the Wi-Fi transceiver 3, and the other subspace can accommodate the Bluetooth transceiver 2. Mold compound materials 6 further fill between the Wi-Fi transceiver 3 and the metal partition structure 5 and between the Bluetooth transceiver 2 and the metal partition structure 5. The metal partition structure 5 is formed by solidification of conductive adhesive. However, current conductive adhesive mostly includes precious metal materials such as gold and silver, resulting in relatively high costs of the conductive adhesive, which is not beneficial to reducing process costs of the system in a package. In addition, compared with a metal conductor, the conductive adhesive has a lower conductivity, and an electromagnetic shielding effect is not ideal. Therefore, a shielding requirement cannot be met.

SUMMARY

This application provides a packaging module and a packaging method therefor, and an electronic device, to improve a shielding effect of the packaging module.

According to a first aspect, a packaging module is provided and applied to an electronic device to improve a shielding effect of the packaging module. The packaging module includes a substrate configured to bear a device and at least two device groups disposed on the substrate, where the at least two device groups are different device groups requiring electromagnetic isolation. The packaging module further includes a shielding structure configured to shield the at least two device groups. The shielding structure includes a partition structure configured to perform electromagnetic isolation between every two adjacent device groups. To improve a shielding effect, the partition structure provided in this application includes at least a conductive pillar and conductive adhesive, where a conductivity of the conductive pillar is greater than a conductivity of the conductive adhesive. There are a plurality of conductive pillars, and the plurality of conductive pillars are electrically connected to a ground layer of the substrate. The plurality of conductive pillars are arranged at intervals, and there is a gap between any adjacent conductive pillars. The conductive adhesive fills the gap between any adjacent conductive pillars, and any adjacent conductive pillars are electrically connected by using the conductive adhesive, so that the conductive pillar and the conductive adhesive form a wall-like structure, to perform electromagnetic isolation between two device groups. It can be learned from the foregoing description that the conductive pillar and the conductive adhesive form the partition structure. On one hand, when the conductive pillar is used as a part of the partition structure, a conductivity of the partition structure is improved because the conductivity of the conductive pillar is greater than the conductivity of the conductive adhesive. On the other hand, when the conductive pillar is used as a part of the partition structure, an amount of the conductive adhesive can be reduced, thereby reducing costs of the entire packaging module.

In an example embodiment, the shielding structure further includes a shielding mask, the shielding mask faces at least a part of a surface of the substrate and is electrically connected to the ground layer of the substrate, and the at least two device groups are located in a space enclosed by the shielding mask and the substrate; and the conductive adhesive is electrically connected to the shielding mask. The shielding mask and the substrate form a space for accommodating the at least two device groups.

In an example embodiment, the conductive pillar is in contact with an inner wall of the shielding mask, so that the partition structure is connected to the shielding mask.

In an example embodiment, a gap is formed between the conductive pillar and the shielding mask, and the conductive adhesive fills the gap between the shielding mask and the conductive pillar. The partition structure can be electrically connected to the shielding mask in different manners.

In an example embodiment, when a gap is formed between the conductive pillar and the shielding mask, the gap is less than or equal to 300 μm. The conductive pillar has a specific height to improve an isolation effect of the partition structure.

In an example embodiment, a distance between the conductive pillars is greater than or equal to 50 μm and less than or equal to 100 µm. Density of the conductive pillars is improved, and a shielding effect of the partition structure is improved.

In an example embodiment, the conductive pillars may be pillars having different shapes such as a rectangular pillar, an elliptic pillar, or a cylinder. The shielding effect of the partition structure can be improved by using the conductive pillars of different shapes.

In an example embodiment, when the conductive pillar is a cylinder, a diameter of the conductive pillar is greater than or equal to 20 µm and less than or equal to 50 µm, to ensure that the conductive pillar has a specific volume, and the shielding effect of the partition structure is improved.

In an example embodiment, the plurality of conductive pillars are arranged into a plurality of rows, and a direction of the row is a length direction of the partition structure; the packaging module further includes a mold compound, the at least two device groups are all plastically packaged in the mold compound, and a part of a side wall of each conductive pillar is wrapped by the mold compound; one groove is provided between two adjacent rows of conductive pillars, and apart of the side wall of each conductive pillar is exposed in the groove; and the conductive adhesive fills the groove, and wraps the part of the side wall of each conductive pillar exposed in the groove. The conductive pillar and the conductive adhesive are electrically connected by filling the groove with the conductive adhesive.

In an example embodiment, the plurality of conductive pillars are arranged into two rows, and conductive pillars in the two rows of conductive pillars are aligned one by one; or the plurality of conductive pillars are arranged into two rows, and conductive pillars in the two rows of conductive pillars are staggered. The conductive pillars may be arranged in different manners.

In an example embodiment, the plurality of conductive pillars are arranged into a plurality of rows, and a direction of the row is a length direction of the partition structure.

The packaging module further includes a mold compound, the at least two device groups are all plastically packaged in the mold compound, and a part of a side wall of each conductive pillar is wrapped by the mold compound; one filling hole is provided among every four adjacent conductive pillars, and a part of the side wall of each conductive pillar is exposed in a corresponding filling hole; and the conductive adhesive fills each filling hole, and the conductive adhesive wraps the part of the side wall of each conductive pillar exposed in the corresponding filling hole. The conductive pillar and the conductive adhesive are electrically connected by providing a filling hole and filling the filling hole with the conductive adhesive.

In an example embodiment, the plurality of conductive pillars are arranged into one row; the packaging module further includes a mold compound, the at least two device groups are plastically packaged in the mold compound, and a part of a side wall of each conductive pillar is wrapped by the mold compound; one filling hole is provided between every two adjacent conductive pillars, and a part of the side wall of each conductive pillar is exposed in a corresponding filling hole; and the conductive adhesive fills each filling hole, and the conductive adhesive wraps the part of the side wall of each conductive pillar exposed in the corresponding filling hole. The conductive pillar and the conductive adhesive are electrically connected by providing a filling hole and filling the filling hole with the conductive adhesive.

In an example embodiment, a ratio of a volume of the plurality of conductive pillars to a volume of the partition structure is greater than or equal to 10% and less than or equal to 30%. This ensures a proportion of the conductive pillars in the partition structure, improves the conductivity of the partition structure, and further improves the shielding effect of the partition structure.

According to a second aspect, an electronic device is provided. The electronic device may be a mobile terminal such as a mobile phone, a tablet computer, or a smartwatch. The electronic device includes a circuit board and the packaging module according to any one of the foregoing, and the packaging module is fixed to the circuit board. In the technical solution, a conductive pillar and conductive adhesive form a partition structure. On one hand, when the conductive pillar is used as a part of the partition structure, a conductivity of the partition structure is increased because a conductivity of the conductive pillar is greater than a conductivity of the conductive adhesive. On the other hand, when the conductive pillar is used as a part of the partition structure, an amount of the conductive adhesive can be reduced, and costs of the entire shielding structure can be reduced, thereby reducing costs of the entire packaging module.

In an example embodiment, the circuit board of the electronic device is a substrate of the packaging module. Therefore, a structure in the electronic device is simplified.

According to a third aspect, a method for preparing a packaging module is provided, including the following steps:

disposing at least two device groups on a substrate;

disposing a plurality of conductive pillars electrically connected to a ground layer of the substrate on the substrate, where the plurality of conductive pillars are arranged at intervals, and the plurality of conductive pillars perform isolation between every two adjacent device groups;

filling a gap between the plurality of conductive pillars with conductive adhesive, and electrically connecting adjacent conductive pillars; and performing electromagnetic isolation between every two adjacent device groups by using the conductive pillar and the conductive adhesive.

In the technical solution, a conductive pillar and conductive adhesive form a partition structure. On one hand, when the conductive pillar is used as a part of the partition structure, a conductivity of the partition structure is increased because a conductivity of the conductive pillar is greater than a conductivity of the conductive adhesive. On the other hand, when the conductive pillar is used as a part of the partition structure, an amount of the conductive adhesive can be reduced, and costs of the entire shielding structure can be reduced, thereby reducing costs of the entire packaging module.

In an example embodiment, the disposing a plurality of conductive pillars electrically connected to a ground layer of the substrate on the substrate, where the plurality of conductive pillars are arranged at intervals, and the plurality of conductive pillars perform isolation between every two adjacent device groups includes:

arranging the plurality of conductive pillars into a plurality of rows;

arranging a mold compound to wrap the at least two device groups and the plurality of conductive pillars;

providing one groove between two adjacent rows of conductive pillars, where a part of a side wall of each conductive pillar is wrapped by the mold compound, and a part of the side wall is exposed in the groove; and filling the groove with the conductive adhesive, where the conductive adhesive wraps the part of the side wall of each conductive pillar exposed in the groove. The conductive pillar and the conductive adhesive are electrically connected by filling the groove with the conductive adhesive, to form the partition structure.

In an example embodiment, the disposing a plurality of conductive pillars electrically connected to a ground layer of the substrate on the substrate, where the plurality of conductive pillars are arranged at intervals, and the plurality of conductive pillars perform isolation between every two adjacent device groups includes:
  arranging the plurality of conductive pillars into a plurality of rows;
  arranging a mold compound to wrap the at least two device groups and the plurality of conductive pillars;
  providing one filling hole among every four adjacent conductive pillars, where a part of a side wall of each conductive pillar is wrapped by the mold compound, and a part of the side wall is exposed in a corresponding filling hole; and
  filling the filling hole with the conductive adhesive, where the conductive adhesive wraps the part of the side wall of each conductive pillar exposed in the corresponding filling hole. The conductive pillar and the conductive adhesive are electrically connected by filling the filling hole with the conductive adhesive, to form the partition structure.

In an example embodiment, the disposing a plurality of conductive pillars electrically connected to a ground layer of the substrate on the substrate, where the plurality of conductive pillars are arranged at intervals, and the plurality of conductive pillars perform isolation between every two adjacent device groups includes:
  arranging the plurality of conductive pillars into one row;
  arranging a mold compound to wrap the at least two device groups and the plurality of conductive pillars;
  providing one filling hole between every two adjacent conductive pillars, where a part of a side wall of each conductive pillar is wrapped by the mold compound, and a part of the side wall is exposed in a corresponding filling hole; and
  filling the filling hole with the conductive adhesive, where the conductive adhesive wraps the part of the side wall of each conductive pillar exposed in the corresponding filling hole. The conductive pillar and the conductive adhesive are electrically connected by filling the filling hole with the conductive adhesive, to form the partition structure.

DESCRIPTION OF EMBODIMENTS

The following further describes embodiments of this application with reference to the accompanying drawings.

First, a packaging module is described. The packaging module is applied to an electronic device having a communication function such as a compact portable electronic device (for example, a smartphone, a smartwatch, or a wireless router). These electronic devices include devices such as radio frequency transceiver circuits related to Wi-Fi, Bluetooth, and cellular signals that are susceptible to radio frequency interference; and other devices such as a processor and a memory that require clock signals. The devices may electromagnetically interfere with each other during normal work. To protect a device from being affected by electromagnetic interference, some circuits (for example, radio frequency transceivers) may be wrapped by using a metal shielding mask and integrated into a packaging module, to block signals and shield the electromagnetic interference. When the packaging module is integrated, there are generally at least two devices that generate electromagnetic interference in the packaging module. Therefore, isolation is performed between the devices in the packaging module. In the conventional technology, isolation between devices inside the packaging module is formed by using silver adhesive. However, on one hand, the silver adhesive is relatively expensive, and on the other hand, an isolation effect is relatively low, which cannot meet a current isolation requirement. Therefore, an embodiment of this application provides a packaging module for improving an isolation effect. The following describes the packaging module provided in this embodiment of this application with reference to the accompanying drawings and specific embodiments.

Figure 1:
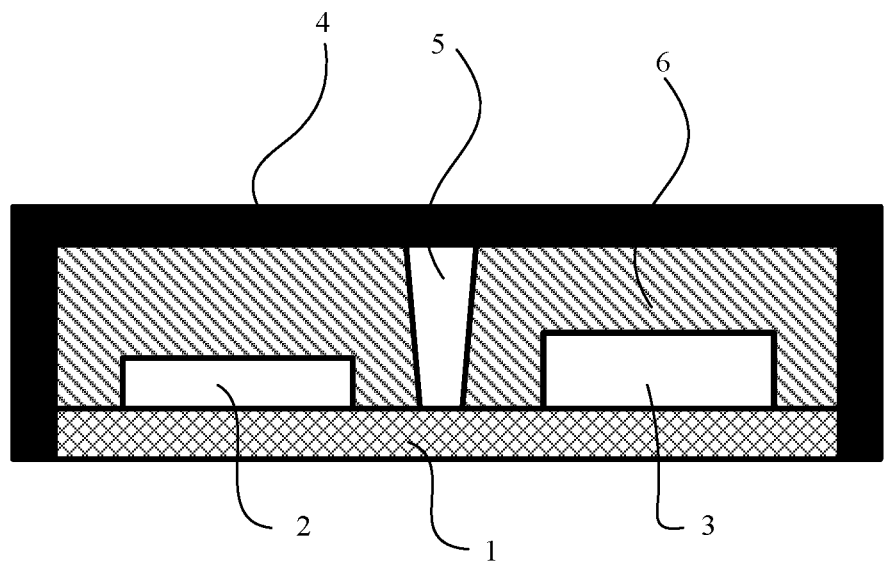
FIG. 1 is an example schematic diagram of a structure of a packaging module in the conventional technology.
Figure 2A:
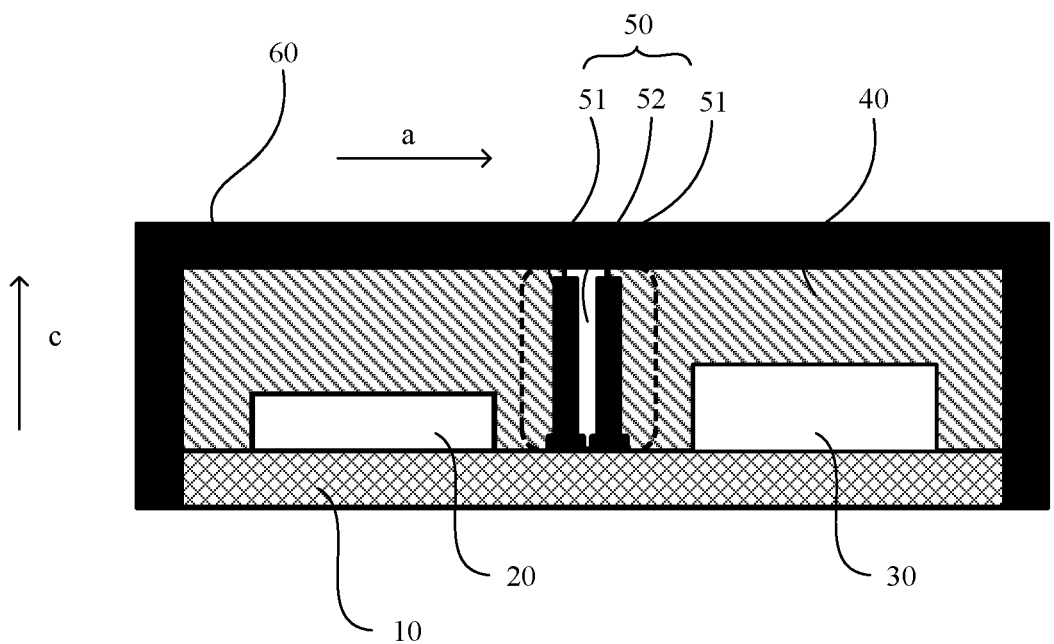
FIG. 2a is an example cross-sectional view of a packaging module according to an embodiment of this application.

FIG. 2a is a cross-sectional view of a packaging module according to an embodiment of this application. The packaging module includes a substrate 10 and a device that is borne on the substrate 10, and further includes a shielding structure (not shown in the figure) configured to shield the device. The shielding structure is configured to perform electromagnetic isolation between devices, to shield the devices or the device from an external environment. The device may be a radio frequency transceiver circuit related to a Wi-Fi, Bluetooth, or cellular signal, or a device such as a processor or a memory using a clock signal.

Different types of substrates such as a printed circuit board or a plate layer laid with a circuit may be used for the substrate 10. The substrate 10 has a bearing surface, and the bearing surface may be two opposite surfaces on the substrate 10 or one surface of the two surfaces. When the device is disposed, the device may be disposed on the bearing surface and is electrically connected to a circuit layer of the substrate 10. The circuit layer includes a metal layer disposed on the substrate 10 or in the substrate 10 and a pad configured to be electrically connected to the device and the shielding structure. When the shielding structure is disposed, the shielding structure may be electrically connected to a ground layer (a part of a circuit in the circuit layer) of the substrate 10, to perform electromagnetic isolation on the device.

A same bearing surface of the substrate 10 can bear a plurality of devices. For ease of description, the devices are grouped into at least two device groups based on disposing positions of the devices and electromagnetic interference between the devices, and each device group does not include devices that electromagnetically interfere with each other.

FIG. 2a shows a case in which a packaging module includes two device groups. The packaging module includes a first device group 20 and a second device group 30. Each of the first device group 20 and the second device group 30 is a combination including at least one device. The first device group 20 may include only one device or may include two or more devices. It should be understood that when the first device group 20 includes two or more devices, the two or two devices should not cause electromagnetic interference. For the second device group 30, references may be made to the description of the first device group 20. When the first device group 20 and the second device group 30 are specifically obtained through grouping, quantities of devices in the first device group 20 and the second device group 30 may be the same or may be different. For example, the first device group 20 includes N devices, and the second device group 30 includes N devices, where N is a natural number. Alternatively, the first device group 20 includes N devices, and the second device group 30 includes M devices, where N and M are unequal natural numbers.

In an optional solution, the packaging module further includes a mold compound 40, and the mold compound 40 is configured to wrap at least two device groups, to ensure devices in each device group. The mold compound 40 may be prepared from different materials. For example, the mold compound 40 may be prepared from epoxy resin, an acrylic resin material, a dielectric material, a thermosetting material, a thermoplastic material, rubber, or another insulating material. During preparation, the mold compound 40 may be formed in a molding tool by using an injection process, and the mold compound 40 wraps devices in each device group, to protect each device and perform isolation between the devices.

The shielding structure is configured to shield the at least two device groups, to avoid electromagnetic interference. The shielding structure includes a shielding mask 60 and a partition structure 50. The shielding mask 60 faces at least a part of a surface of the substrate 10 and is electrically connected to the ground layer of the substrate 10, to implement grounding. The shielding mask 60 and the substrate 10 enclose to form an accommodating space, and the first device group 20 and the second device group 30 are accommodated in the space enclosed by the shielding mask 60 and the substrate 10. Different structures may be used for the shielding mask 60. For example, the shielding mask 60 may be a metal layer covering the mold compound 40 or may be a housing structure.

The partition structure 50 is disposed in the shielding mask 60 and is electrically connected to the shielding mask 60. In addition, the partition structure 50 divides a space in the shielding mask 60 into a plurality of subspaces. Each subspace correspondingly accommodates one device group, and each subspace is a shielded space formed by the shielding mask 60 and the partition structure 50.

The first device group 20 and the second device group 30 are used as an example. When electromagnetic isolation is performed between the first device group 20 and the second device group 30, the partition structure 50 is configured to perform electromagnetic isolation on the first device group 20 and the second device group 30. It should be understood that when there are at least two device groups, for example, when there are three or four device groups, the partition structure 50 needs to be able to perform electromagnetic isolation between every two adjacent device groups in the at least two device groups. When the packaging module has the mold compound 40, the partition structure 50 may be embedded in the mold compound 40, to facilitate the arrangement of the partition structure 50.

The partition structure 50 between every two adjacent device groups has a similar structure. Therefore, the partition structure 50 between the first device group 20 and the second device group 30 is used as an example for description.

Figure 2B:
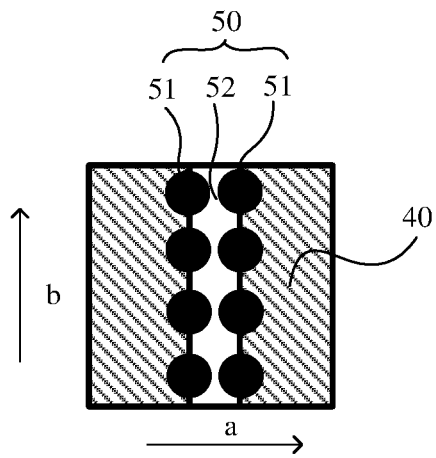
FIG. 2b is an example top view of a partition structure of a packaging module according to an embodiment of this application.

Referring to FIG. 2a and FIG. 2b together, FIG. 2b is a local top view of a partition structure. For ease of description, a direction a and a direction b are defined. The direction a is an arrangement direction of the first device group 20 and the second device group 30; and the direction b is a direction in which signal isolation is required between the first device group 20 and the second device group 30. A plane where the direction b and the direction a are located is parallel to the bearing surface of the substrate 10. The direction b may be perpendicular to the direction a or form an angle with the direction a, where the angle may be any acute angle greater than 0° and less than 90°, for example, the angle may be 5°, 10°, 30°, 50°, 60°, or 89°.

The partition structure 50 is located between the first device group 20 and the second device group 30, and a length direction of the partition structure 50 is set in the direction in which signal isolation is required between the first device group 20 and the second device group 30, that is, the length direction of the partition structure 50 is along the direction b.

The partition structure 50 is a structure in which the conductive pillar 51 and the conductive adhesive 52 are mixed. The partition structure 50 includes a plurality of conductive pillars 51, and the plurality of conductive pillars 51 are arranged into two rows. The conductive pillars 51 in each row of conductive pillars are arranged in the direction b, and the two rows of conductive pillars are arranged in the direction a. Among the two rows of conductive pillars 51, a gap is formed between two adjacent conductive pillars 51 in the direction a, and a gap is also formed between two adjacent conductive pillars 51 in the direction b. In an optional solution, the conductive pillars 51 in the two rows of conductive pillars are aligned one by one, that is, two conductive pillars 51 are arranged in a row in the direction a, and the plurality of conductive pillars 51 are arranged in a matrix.

When the conductive pillar 51 is disposed on the substrate 10, the conductive pillar 51 is electrically connected to the ground layer of the substrate 10. When the packaging module has the mold compound 40, the mold compound 40 wraps the first device group 20, the second device group 30, and the plurality of conductive pillars 51. In addition, a groove (not shown in the figure, and for a shape of the groove, references may be made to a shape of the conductive adhesive 52) is provided on the mold compound 40, and the groove is configured to accommodate the conductive adhesive 52. When filling the groove, the conductive adhesive 52 is electrically connected to the conductive pillar 51, to form the partition structure 50.

When the groove is formed, the groove is provided between two adjacent rows of conductive pillars 51, and a length direction of the groove is along the direction b. In FIG. 2b, for example, the groove is a rectangular groove, but the groove provided in this embodiment of this application may be alternatively in another shape such as an elliptic shape or a long waist shape. Regardless of the shape of the groove, it should be ensured that only a part of a side wall of each conductive pillar 51 is exposed in the groove and a part is wrapped by the mold compound 40. The rectangular groove shown in FIG. 2b is used as an example, and a bottom wall of the groove is the bearing surface of the substrate 10. A part of a side wall of each conductive pillar 51 is exposed in the groove, that is, a part of a structure of each conductive pillar 51 protrudes into the groove.

The groove may be prepared by using different processes. For example, the groove may be formed by laser etching or in another etching manner. In laser cutting, a workpiece is irradiated by a focused high power density laser beam, so that the irradiated material is rapidly melted, vaporized, ablated, or reaches an ignition point, and the molten material is blown away simultaneously by using a high-speed air flow coaxial with the beam, to cut the workpiece. In the laser cutting manner, accuracy of groove opening can be ensured, so that it is ensured that the part of the side wall of the conductive pillar 51 is exposed into the groove.

When filling the groove, the conductive adhesive 52 fully fills the entire groove. The filled conductive adhesive 52 wraps the part of the side wall of each conductive pillar 51 exposed in the groove and is conductively connected to the conductive pillar 51. It can be learned from FIG. 2a and FIG. 2b that when the conductive adhesive 52 is disposed, the conductive adhesive 52 fills a gap between any adjacent conductive pillars 51, and any adjacent conductive pillars 51 can be electrically connected by using the conductive adhesive 52, so that the conductive pillars 51 and the conductive adhesive 52 form a wall-like structure. With reference to disposing manners of the conductive pillar 51 and the conductive adhesive 52, the partition structure 50 may be viewed as a wall structure formed by connecting the plurality of conductive pillars 51 in series by using the conductive pillars 51 as a main structure and the conductive adhesive 52 as a connection structure. When the conductive pillar 51 and the conductive adhesive 52 are selected, a conductivity of the conductive pillar 51 is greater than a conductivity of the conductive adhesive 52, so that a conductivity of the partition structure 50 is increased by using the conductive pillar 51. In addition, when the partition structure 50 is formed by mixing the conductive pillar 51 and the conductive adhesive 52, a side surface (a surface of the part of the side wall wrapped by the mold compound 40) of the conductive pillar 51 may be used as an electromagnetic signal reflection surface, to improve reflection of an electromagnetic signal by the partition structure 50 and improve a degree of isolation of the partition structure 50.

In an optional solution, an area of the part of the side wall of the conductive pillar 51 exposed in the groove accounts for $1/4$ to $1/2$ of an area of the side wall of the conductive pillar 51. For example, the area of the part of the side wall of the conductive pillar 51 exposed in the groove accounts for a different proportion such as $1/2$, $1/3$, or $1/4$ of the total area of the side wall of the conductive pillar 51. In the arrangement manner, a contact area between the conductive pillar 51 and the conductive adhesive 52 is ensured, a resistance of the partition structure 50 is reduced, and an amount of the conductive adhesive 52 can also be reduced.

In an optional solution, a ratio of a total volume V1 of the plurality of conductive pillars 51 to a volume V2 of the partition structure 50 is greater than or equal to 10% and less than or equal to 30%. The total volume V1 of the plurality of conductive pillars 51 is a sum of volumes v of the plurality of conductive pillars 51; and the volume V2 of the partition structure 50 is a sum of the total volume V1 of the plurality of conductive pillars 51 and a volume V3 of the conductive adhesive 52. For example, the ratio of V1:V2 may be any value from 10% to 30% such as 10%, 15%, 20%, 25%, or 30%. When the ratio is used, it can be ensured that the disposed conductive pillar 51 can improve the conductivity of the entire partition structure 50. In addition, when the conductive pillars 51 of the ratio are used, and when the total volume V2 of the partition structure 50 is not changed, the amount of the conductive adhesive 52 can be reduced by 10% to 30% compared with an equal-volume partition structure prepared by using the conductive adhesive in the conventional technology.

In an optional solution, a distance between the conductive pillars 51 is greater than or equal to 50 μm and less than or equal to 100 μm, to meet a groove opening process in the conventional technology and reduce a size of the groove, thereby reducing the amount of the conductive adhesive 52. For example, the distance between the conductive pillars 51 may be any distance from 50 μm to 100 μm such as 50 μm, 80 μm, 120 μm, 200 μm, 240 μm, 280 μm, or 100 μm. It should be understood that the distance between the conductive pillars 51 includes a distance between two adjacent conductive pillars 51 in the direction a and a distance between two adjacent conductive pillars 51 in the direction b.

The conductive pillar 51 may be a conductive pillar prepared from different materials. For example, the conductive pillar 51 may be prepared from a common conductive material such as copper, aluminum, iron, silver, or gold. Preferably, the conductive pillar 51 is a copper pillar, which has a good conductivity and relatively low costs. When silver adhesive is used for the conductive adhesive 52 and a copper pillar is used for the conductive pillar 51, the costs of the partition structure 50 can be reduced. In addition, in the arrangement manner of the conductive pillar 51 and the conductive adhesive 52, the amount of the conductive adhesive 52 can be further reduced, and the costs of the partition structure 50 can be further reduced.

The conductive pillar 51 may be in different shapes. For example, the conductive pillar 51 may be a pillar in different shapes such as a rectangle, an ellipse, or a cylinder. In this embodiment of this application, the conductive pillar 51 is preferably a cylinder. On one hand, preparation is convenient, and on the other hand, the conductive pillar is conveniently connected to the conductive adhesive 52. In addition, the conductive pillar 51 may be a straight cylinder having a constant diameter, or may be a stepped pillar or a tapered pillar having a variable diameter, which can be determined based on an actual requirement during specific application.

In an optional solution, when the conductive pillar 51 is a cylinder, a diameter of the conductive pillar 51 is greater than or equal to 20 μm and less than or equal to 50 μm, to ensure that the conductive pillar 51 has a specific volume. For example, the diameter of the conductive pillar 51 may be in any size from 20 μm to 50 μm such as 20 μm, 25 μm, 30 μm, 35 μm, 40 μm, 45 μm, or 5 μm.

When the conductive pillar 51 is electrically connected to the ground layer of the substrate 10, each conductive pillar 51 is electrically connected to the ground layer by using a pad on the substrate 10. The conductive pillar 51 may be connected to the pad in different manners. For example, two rows of conductive pillars 51 may be implanted on the substrate 10 by using a wire bonding process. Wire bonding is to tightly bond metal leads to the pad of the substrate 10 by using heat, pressure, or ultrasonic energy through thin metal wires. Alternatively, the conductive pillars 51 may be conductively connected in different welding manners such as argon arc welding or laser welding.

In an optional solution, a diameter of the pad of the substrate 10 is greater than the diameter of the conductive pillar 51. For example, the diameter of the pad may be in a different size such as 60 μm, 70 μm, or 80 μm greater than the diameter of the conductive pillar 51. When a pad with a relatively large size is used, welding between the conductive pillar 51 and the pad is facilitated, and an electrical connection effect between the conductive pillar 51 and the ground layer can also be improved by using the pad with the relatively large size.

In an optional solution, a part of the pad of the substrate 10 is exposed in the groove, and when the conductive adhesive 52 fills the groove, the conductive adhesive 52 can be electrically connected to the pad exposed in the groove. An electrical connection effect between the partition structure 50 and the ground layer is improved, and an electromagnetic isolation effect of the partition structure 50 is further improved.

When the partition structure 50 is electrically connected to the shielding mask 60, this includes, but is not limited to, that a top end and a side wall of the partition structure 50 are respectively electrically connected to a top wall and a side wall of the shielding mask, that is, the top end of the partition structure 50 is electrically connected to the top wall of the shielding mask 60 or the side end of the partition structure 50 is electrically connected to the side wall of the shielding mask 60. For ease of description, a direction c is introduced in FIG. 2a, the direction c is perpendicular to the bearing surface of the substrate 10, and the direction c is separately perpendicular to the direction a and the direction b. As shown in FIG. 2a, a height of the partition structure 50 is along the direction c, and the top end of the partition structure 50 refers to an end surface of the partition structure 50 facing away from the substrate 10. When the partition structure 50 is disposed, the top end of the partition structure 50 is electrically connected to a top surface (a surface of a disposing surface, on which the first device group 20 is disposed, of the shielding mask 60 facing the substrate 10) of the shielding mask 60. When a metal layer is used for the shielding mask 60, the partition structure 50 is exposed outside the mold compound 40, and when the metal layer is formed on the mold compound 40, the metal layer covers the top end of the partition structure 50 and is electrically connected to the partition structure 50.

The top end of the partition structure 50 may be electrically connected to the top surface of the shielding mask 60 in different manners. For example, the shielding mask 60 is electrically connected to the partition structure 50 by using only the conductive adhesive 52, and the conductive pillar 51 is not directly electrically connected to the shielding mask 60. As shown in FIG. 2a, the shielding mask 60 covers the conductive adhesive 52 and is electrically connected to the conductive adhesive 52. A gap is formed between the conductive pillar 51 and the shielding mask 60, and the conductive pillar 51 is electrically connected to the shielding mask 60 by using the conductive adhesive 52. For example, the gap formed between the conductive pillar 51 and the shielding mask 60 is less than or equal to 300 μm. Specifically, the gap between the conductive pillar 51 and the shielding mask 60 may be any gap in a size less than or equal to 300 μm such as 10 μm, 20 μm, 50 μm, 100 μm, 120 μm, 150 μm, 200 μm, 250 μm, 290 μm, or 300 μm in the direction c. When the structure is used, a length of the conductive pillar 51 meets that a minimum distance from an inner wall of the shielding mask 60 is less than or equal to 300 μm, ensuring that the conductive pillar 51 has a sufficient height, thereby improving an isolation effect between the first device group 20 and the second device group 30. When the partition structure 50 is connected to the shielding mask 60, the partition structure may be alternatively connected to the shielding mask 60 by using the conductive pillar 51. That is, the top end of the conductive pillar 51 is in contact with the inner wall of the shielding mask 60, and the conductive pillar is directly connected to the shielding mask. When the conductive pillar 51 is directly connected to the shielding mask 60, the plurality of conductive pillars 51 isolate the first device group 20 from the second device group 30, and the isolation effect between the first device group 20 and the second device group 30 can be improved.

Figure 3:
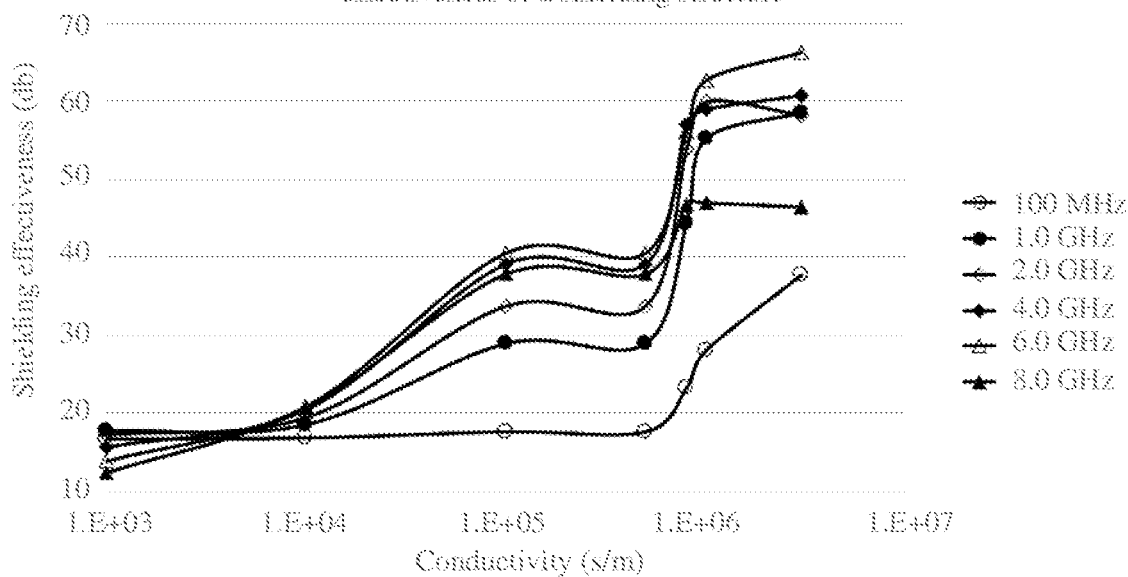
FIG. 3 is an example diagram of a correspondence between a conductivity of a material and a shielding effect according to an embodiment of this application.

To facilitate understanding of an effect of the partition structure 50 provided in this embodiment of this application, the following describes the partition structure with reference to FIG. 3. FIG. 3 is an example of a schematic diagram of simulation of different electrical conductivity materials for different frequency signals in the following table. It can be learned from FIG. 3 that electromagnetic shielding effectiveness of a structure with a low conductivity is lower than electromagnetic shielding effectiveness of a structure with a high conductivity. For example, shielding effectiveness for a low-frequency signal can reach 15 db, and shielding effectiveness for a high-frequency signal can reach 2 to 8 db. A metal adhesive material in the conventional technology is a porous structure, and an electrical conductivity thereof is about $5e^5$ S/m, which is about two orders of magnitude less than an electrical conductivity ($5.7e^7$) of a pure copper material. Therefore, electromagnetic effectiveness of the metal adhesive material is also poor. However, a structure in which a copper pillar and silver adhesive are mixed is used for the partition structure 50 provided in this embodiment, and a conductivity of the entire structure can be improved. Therefore, a better electromagnetic shielding effect can be achieved.

To facilitate understanding of a preparation process of the packaging module provided in this embodiment of this application, the following describes the preparation process of the packaging module in detail.

A method for preparing a packaging module according to an embodiment of this application includes the following steps.

Step 001: Dispose at least two device groups on a substrate.

Figure 4A:
FIG. 4a to FIG. 4g are example processes of preparing a packaging module according to an embodiment of this application.
Figure 4B:
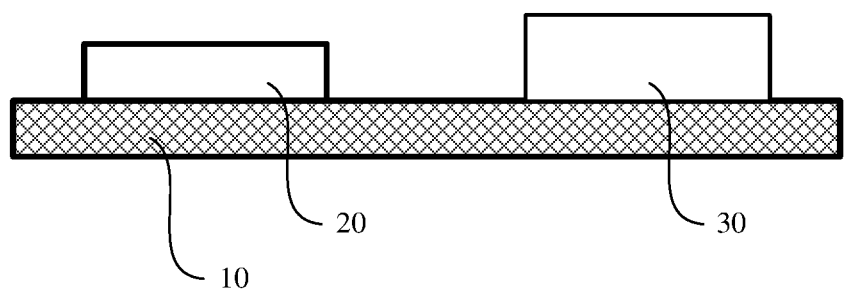

As shown in FIG. 4a, the step includes: preparing a substrate 10, where the substrate 10 may be a printed circuit board or a substrate of another type. However, regardless of the type of the substrate, the substrate 10 includes at least one metal wiring layer. The metal wiring layer includes a circuit layer and a ground layer that are electrically connected to at least two device groups. In addition, a plurality of pads are further disposed on the substrate 10, for example, a pad configured to be electrically connected to the at least two device groups and a pad configured to be electrically connected to a shielding structure. As shown in FIG. 4b, when the at least two device groups are disposed, devices such as the first device group 20 and the second device group 30 shown in FIG. 4b are mounted on a bearing surface of the substrate 10. The devices in the device groups may include various active or passive devices, chips, isolated components, or component packages (packaged chips).

Step 002: Dispose a plurality of conductive pillars electrically connected to a ground layer of the substrate on the substrate 10, where the plurality of conductive pillars are arranged at intervals, and the plurality of conductive pillars perform isolation between every two adjacent device groups.

Figure 4C:
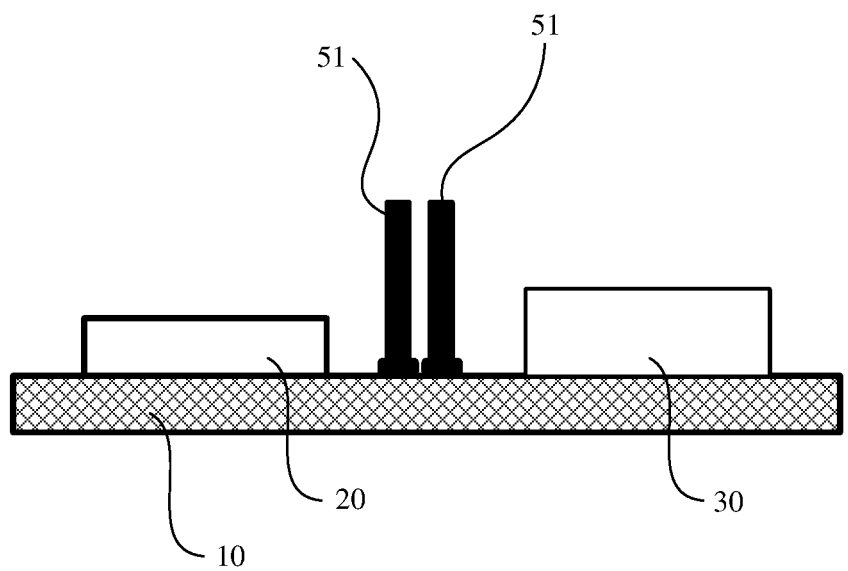

As shown in FIG. 4c, a signal isolation region is designed between two device groups, and two rows of conductive pillars 51 are implanted in the signal isolation region by using a wire bonding process. Wire bonding is to tightly bond metal leads to the pad of the substrate 10 by using heat, pressure, or ultrasonic energy through thin metal wires. A copper pillar may be used for the conductive pillar 51, a diameter of the copper pillar may be 30 μm, and a diameter of the pad connected to the copper pillar may be 60 μm. A distance between centers of two adjacent copper pillars is greater than or equal to 150 μm and less than or equal to 300 μm. In addition, a height of the copper pillar is set to be not higher than a height of a mold compound of the entire system in a package, and a possible height range is 0.1 μm to 1.5 μm.

Step 003: Fill a gap between the plurality of conductive pillars with conductive adhesive, and electrically connect the conductive adhesive and adjacent conductive pillars.

Figure 4D:
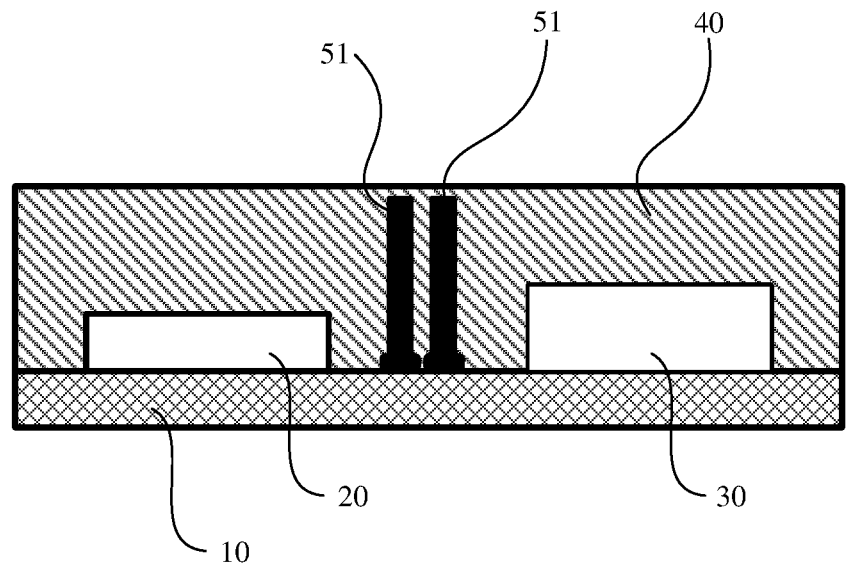

As shown in FIG. 4d, the mold compound 40 is disposed to wrap the first device group 20, the second device group 30, and the plurality of conductive pillar 51, to package the first device group 20, the second device group 30, and the plurality of conductive pillar 51. For example, the mold compound 40 may be prepared from epoxy resin, an acrylic resin material, a dielectric material, a thermosetting material, a thermoplastic material, rubber, or another insulating material. Through the preparation process, an insulation layer may be formed in a molding tool by using an injection process. When there are at least two device groups, the mold compound 40 wraps the at least two device groups.

Figure 4E:
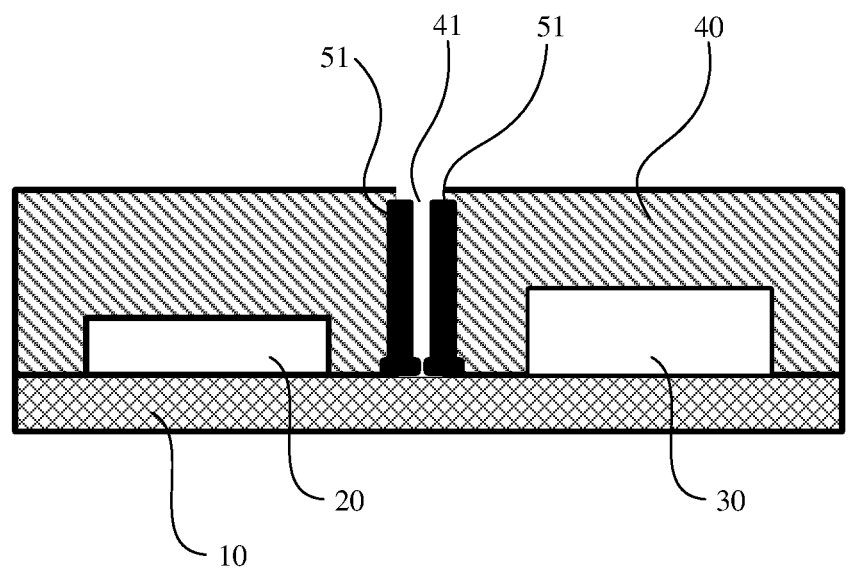

As shown in FIG. 4e, one groove is provided between two adjacent rows of conductive pillars, a part of a side wall of each conductive pillar is wrapped by the mold compound, and a part of the side wall is exposed in the groove. Specifically, a groove 41 is etched by using a laser in a copper pillar region (between two adjacent rows of copper pillars). For example, a laser cutting process may be used. In the laser cutting, a workpiece is irradiated by a focused high power density laser beam, so that the irradiated material is rapidly melted, vaporized, ablated, or reaches an ignition point, and the molten material is blown away simultaneously by using a high-speed air flow coaxial with the beam, to cut the workpiece. Selective groove opening can be implemented based on absorption sensitivity of a material used by the mold compound 40 to laser energy of different wavelengths. During groove opening, only an insulating material of the mold compound 40 is removed selectively, and the conductive pillar 51 remains unremoved. Therefore, a part of the side wall of each conductive pillar 51 is exposed in the groove 41. Optionally, a width of the groove is greater than or equal to 100 μm and less than or equal to 300 μm. For example, the width of the groove may be any width from 100 μm to 300 μm such as 100 μm, 150 μm, 200 μm, 250 μm, or 300 μm. The width of the groove is a width of the groove 41 in an arrangement direction of the first device group 20 and the second device group 30. Optionally, during groove opening, a top end of the copper pillar may be exposed or may not be exposed.

Figure 4F:
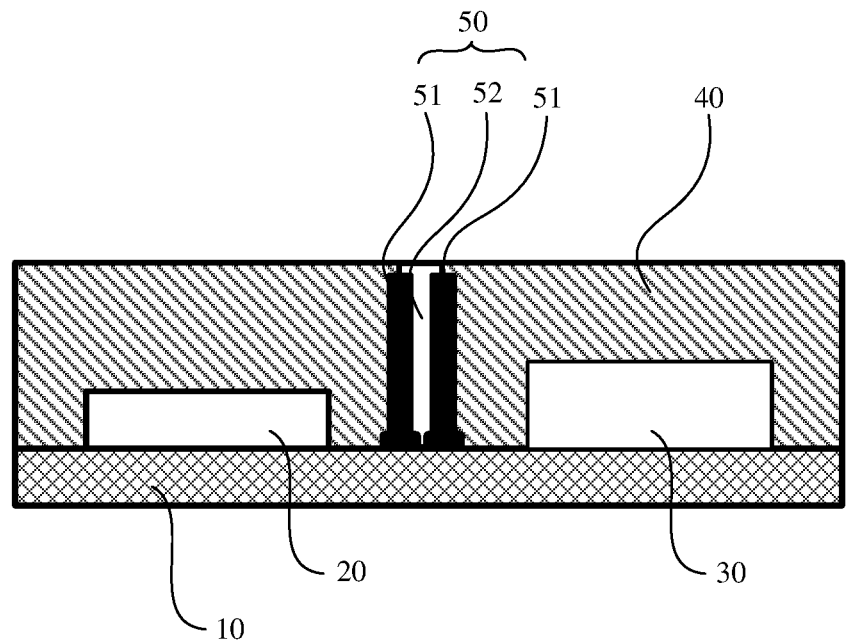

As shown in FIG. 4f, the groove is filled with the conductive adhesive, and the conductive adhesive wraps the part of the side wall of each conductive pillar exposed in the groove. The conductive pillar 51 and the conductive adhesive 52 are electrically connected by filling the groove with the conductive adhesive 52, to form the partition structure 50. Specifically, the etched groove is filled with a material of the conductive adhesive 52. The partially exposed surface of the conductive pillar 51 is electrically communicated with the material of the conductive adhesive 52. A silver adhesive material may be used for the conductive adhesive 52 in this embodiment of this application, the silver adhesive has fluidity and can fully fill a groove structure in a specific pressure and temperature condition, and it can be ensured that the silver adhesive is in good contact with the conductive pillar 51. After the silver adhesive material is filled, thermal curing treatment is performed on the silver adhesive material. For example, a curing process of baking at 100° C. to 175° C. for 0.5 to 2 hours may be used.

Step 004: Prepare a shielding mask 60.

Figure 4G:
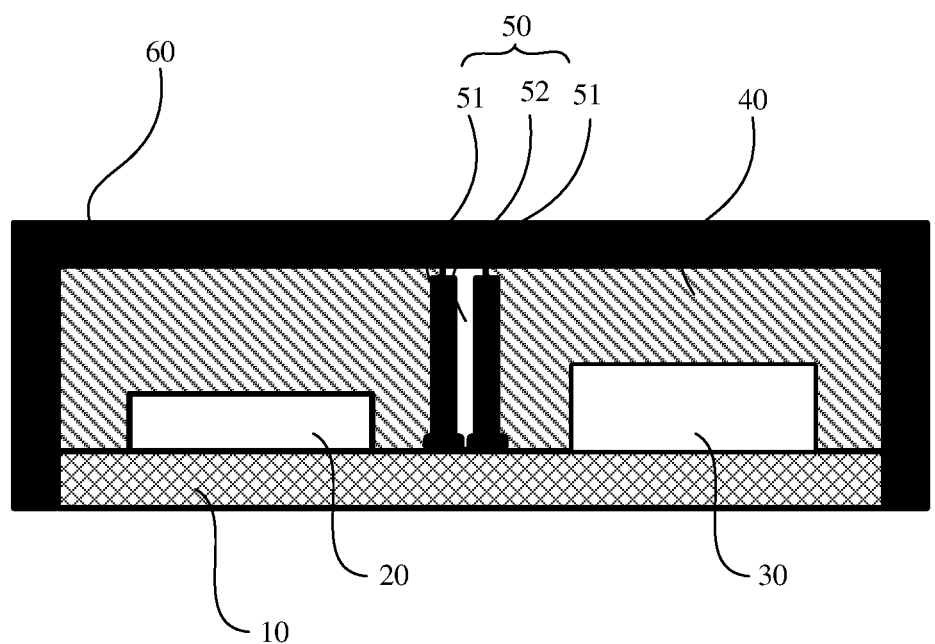

As shown in FIG. 4g, a shielding mask 60 is attached to an upper surface and a side wall of the entire packaging module. Electrical conduction between the conductive adhesive 52 and the shielding mask 60 is implemented. The shielding mask 60 may be prepared by using a physical sputter deposition process. A single layer of a stainless steel layer or a copper layer or a multi-layer combination of a stainless steel layer and a copper layer manner may be used for the shielding mask 60. In addition to stainless steel, another depositable metal material such as copper, nickel, and aluminum may be used for the shielding mask 60. In addition, the shielding mask 60 may be prepared by chemical vapor deposition of metal, electroplating, or the like. The prepared shielding mask 60 is electrically connected to the partition structure 50 and the ground layer of the substrate 10. For an electrical connection manner between the shielding mask 60 and the partition structure 50, references may be made to the related structure description in the foregoing embodiment.

It can be learned from the description that by using the packaging module prepared by using the preparation method, the conductive pillar 51 and the conductive adhesive 52 form the partition structure 50, on one hand, a conductivity of the conductive pillar 51 is greater than that of the conductive adhesive 52, to improve a conductivity of the partition structure 50, and on the other hand, the conductive pillar 51 is used as a part of the partition structure 50, an amount of the conductive adhesive 52 can be reduced, and costs of the entire shielding structure can be reduced, thereby reducing costs of the entire packaging module.

Figure 5A:
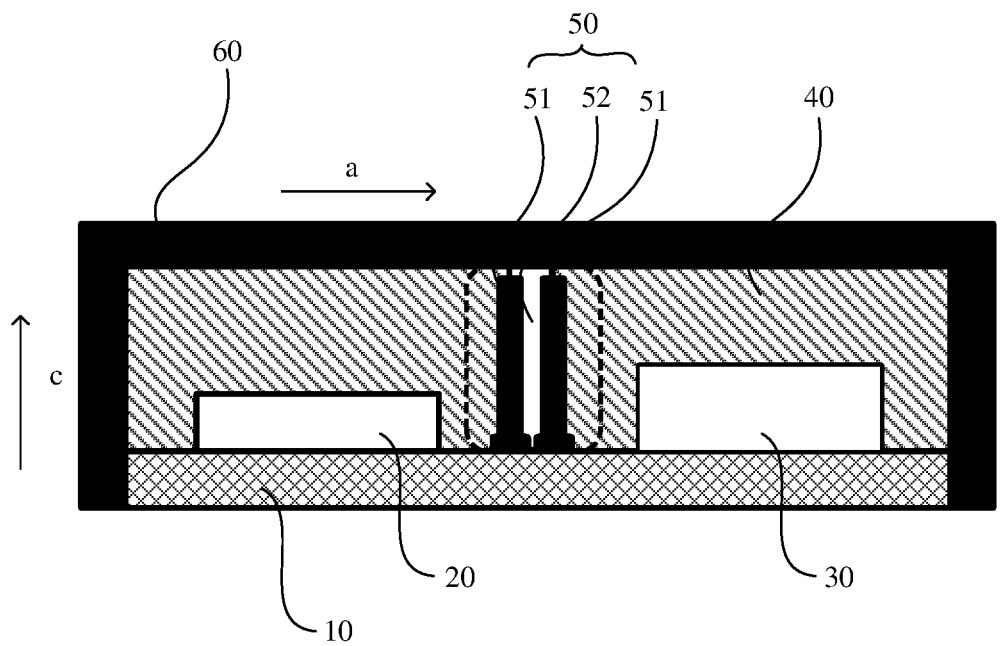
FIG. 5a is an example cross-sectional view of a packaging module according to an embodiment of this application.
Figure 5B:
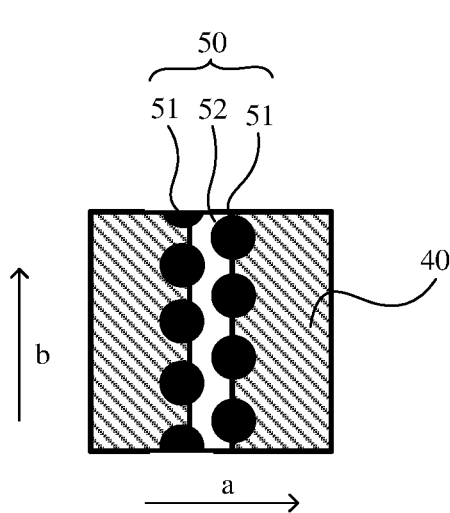
FIG. 5b is an example top view of a partition structure of a packaging module according to an embodiment of this application.

FIG. 5a is a deformed structure of a system in a package according to an embodiment of this application, and FIG. 5b is a top view of a partition structure 50. For some reference signs in FIG. 5a and FIG. 5b, references may be made to the same reference signs in FIG. 2a and FIG. 2b. In the partition structure 50 shown in FIG. 5a and FIG. 5b, a plurality of conductive pillars 51 are arranged into two rows, the conductive pillars 51 in each row of conductive pillars are arranged in the direction b, and the two rows of conductive pillars are arranged in the direction a. Among the two rows of conductive pillars 51, a gap is formed between two adjacent conductive pillars 51 in the direction a, and a gap is also formed between two adjacent conductive pillars 51 in the direction b. In an optional solution, the conductive pillars 51 in the two rows of conductive pillars 51 are staggered. That is, positions of the two rows of conductive pillars 51 are staggered in the direction b. When conductive adhesive 52 is filled, the conductive adhesive 52 wraps a part of a side wall of each conductive pillar 51 exposed in a groove. In an arrangement manner of the conductive pillars 51 shown in FIG. 5b, more side walls of conductive pillars 51 in the two rows of staggered conductive pillars 51 are exposed in the direction b, so that more electromagnetic signal reflection surfaces can be provided, thereby achieving a better electromagnetic shielding effect.

Figure 6A:
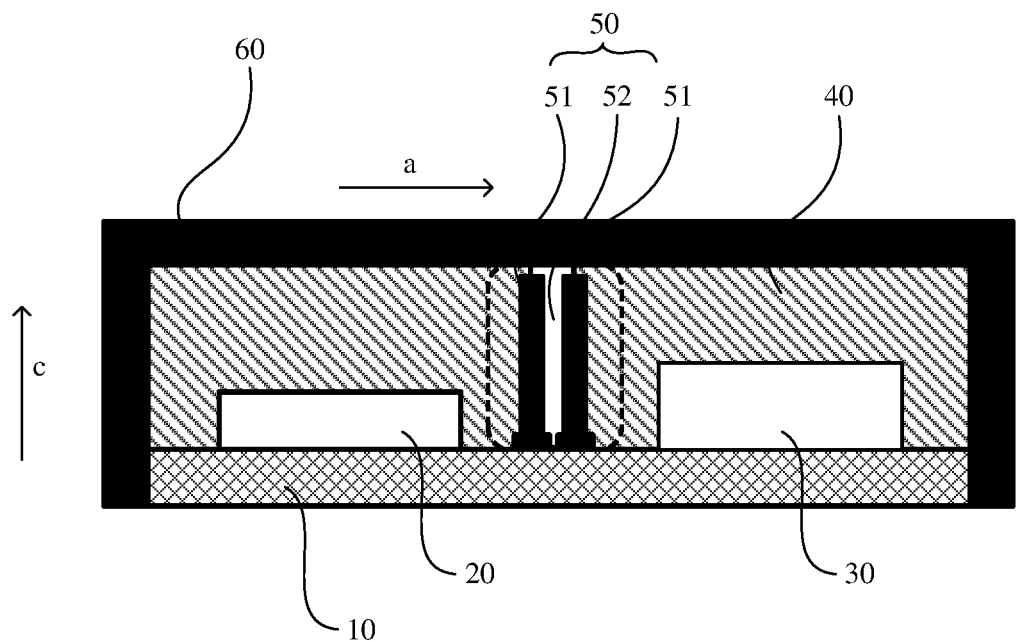
FIG. 6a is an example cross-sectional view of a packaging module according to an embodiment of this application.
Figure 6B:
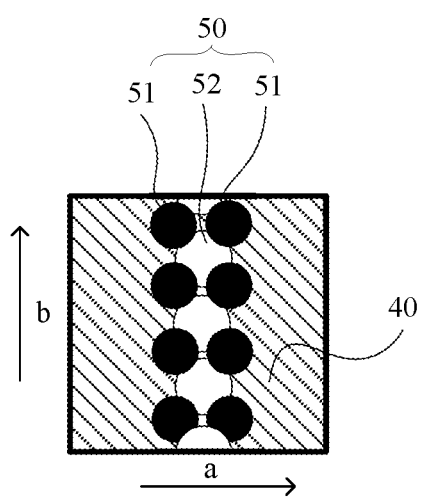
FIG. 6b is an example top view of a partition structure of a packaging module according to an embodiment of this application.

FIG. 6a is a deformed structure of a system in a package according to an embodiment of this application, and FIG. 6b is a top view of a partition structure 50. For some reference signs in FIG. 6a and FIG. 6b, references may be made to the same reference signs in FIG. 2a and FIG. 2b. In the partition structure 50 shown in FIG. 6a and FIG. 6b, a plurality of conductive pillars 51 are arranged into two rows. To fill conductive adhesive 52, one filling hole is provided among every four adjacent conductive pillars 51, and a part of a side wall of each conductive pillar 51 is exposed in a corresponding filling hole. A structure shown in FIG. 6b is used as an example. One filling hole is provided among any adjacent four conductive pillars 51, and a plurality of filling holes are arranged in the direction b. The filling holes and a row of conductive pillars 51 (the conductive pillars 51 arranged in one row in the direction a) are staggered. Each conductive pillar 51 corresponds to at least one filling hole, and a part of a side wall of each conductive pillar 51 is exposed in the corresponding filling hole. The conductive adhesive 52 fills each filling hole, and the conductive adhesive 52 wraps the part of the side wall of each conductive pillar 51 exposed in the corresponding filling hole. The structure shown in FIG. 6b is used as an example. The conductive adhesive 52 filling each filling hole is electrically connected to the part of the side wall of each conductive pillar 51 exposed in the filling hole. The plurality of conductive pillars 51 are conductively connected together in a manner of staggering the filling holes and one row of conductive pillars 51. When the foregoing structure is used, compared with the groove opening manner shown in FIG. 2a and FIG. 2b, an amount of silver adhesive can be further reduced, costs of the shielding structure can be reduced, and costs of the packaging module can also be reduced.

In an optional solution, a diameter of the filling hole may be greater than or equal to 100 μm and less than or equal to 300 μm. For example, the diameter of the filling hole may be in any size from 100 μm to 300 μm such as 100 μm, 150 μm, 200 μm, 250 μm, or 300 μm. When the hole diameter is used, an electrical connection between the conductive pillars 51 can be ensured, a resistance of the formed partition structure 50 can be reduced, and the amount of the conductive adhesive 52 can also be reduced as much as possible.

When the foregoing structure is used, a corresponding preparation method is similar to the preparation method corresponding to FIG. 2a and FIG. 2b. The only difference lies in the step of filling a gap between the conductive pillars 51 with the conductive adhesive 52 and electrically connecting the conductive adhesive and the conductive pillars 51. When the filling hole structure is used, the step may be that: a mold compound 40 is disposed to wrap the first device group 20, the second device group 30, and the plurality of conductive pillars 51. For a specific solution, references may be made to the related description in FIG. 4d. One filling hole is provided among every four adjacent conductive pillars 51, a part of a side wall of each conductive pillar 51 is wrapped by the mold compound, and a part of the side wall is exposed in a corresponding filling hole. For a hole opening process, references may be made to a groove opening process. The conductive adhesive 52 fills the filling hole, and the conductive adhesive 52 wraps the part of the side wall of each conductive pillar 51 exposed in the corresponding filling hole. For a material and a filling process of the conductive adhesive 52, references may be made to the related description in FIG. 4e.

Figure 7A:
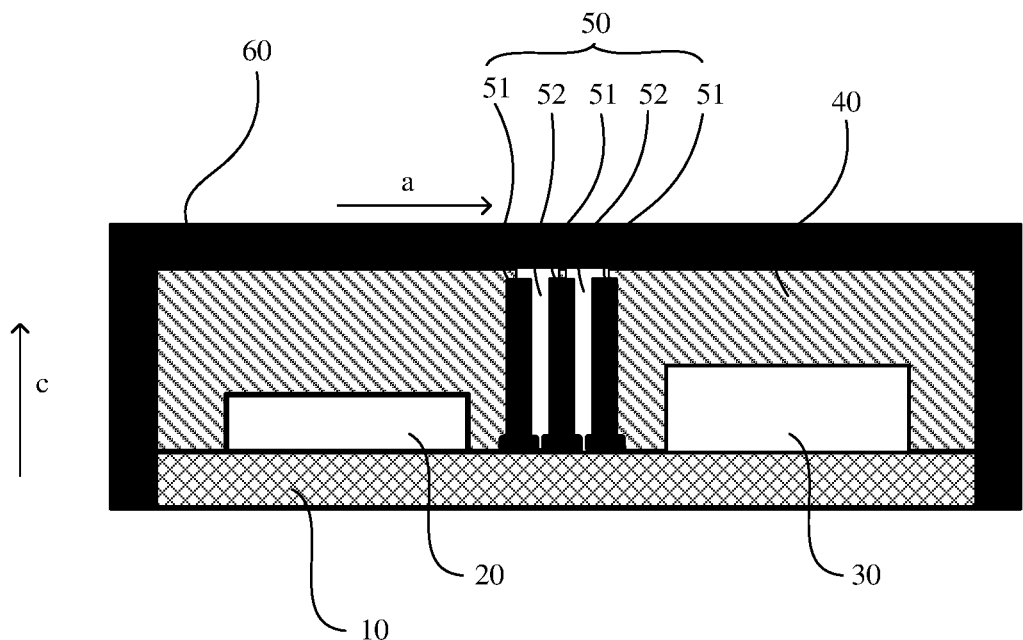
FIG. 7a is an example cross-sectional view of a packaging module according to an embodiment of this application.
Figure 7B:
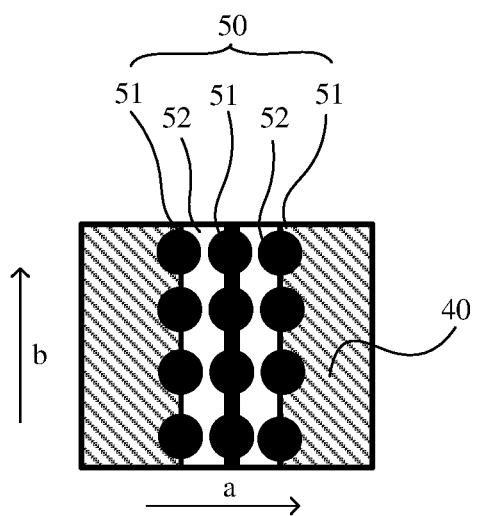
FIG. 7b is an example top view of a partition structure of a packaging module according to an embodiment of this application.

FIG. 7a is a deformed structure of a system in package according to an embodiment of this application, and FIG. 7b is a top view of a partition structure 50. For some reference signs in FIG. 7a and FIG. 7b, references may be made to the same reference signs in FIG. 2a and FIG. 2b. In the partition structure 50 shown in FIG. 7a and FIG. 7b, a plurality of conductive pillars 51 are arranged into three rows, each row of conductive pillars 51 are arranged in the direction b, and the three rows of conductive pillars 51 are arranged in the direction a. Among the three rows of conductive pillars 51, a gap is formed between two adjacent conductive pillars 51 in the direction a, and a gap is also formed between two adjacent conductive pillars 51 in the direction b. In an optional solution, the conductive pillars 51 in the three rows of conductive pillars 51 are aligned one by one, that is, three conductive pillars 51 are arranged in a row in the direction a, and the plurality of conductive pillars 51 are arranged in a matrix. The mold compound 40 is provided with two grooves, the two grooves are arranged in the direction b, and one row of conductive pillars 51 are located between the two grooves. A part of a side wall of each conductive pillar 51 is exposed in a corresponding groove, and when conductive adhesive 52 is filled, the conductive adhesive 52 is electrically connected to the part of the side wall of the conductive pillar 51 exposed in the groove. It can be learned from FIG. 7a and FIG. 7b that in the partition structure 50 provided in this embodiment of this application, a plurality of rows of conductive pillars 51 may alternatively be used, and an effect of isolating the first device group 20 from the second device group 30 can also be achieved.

Figure 8A:
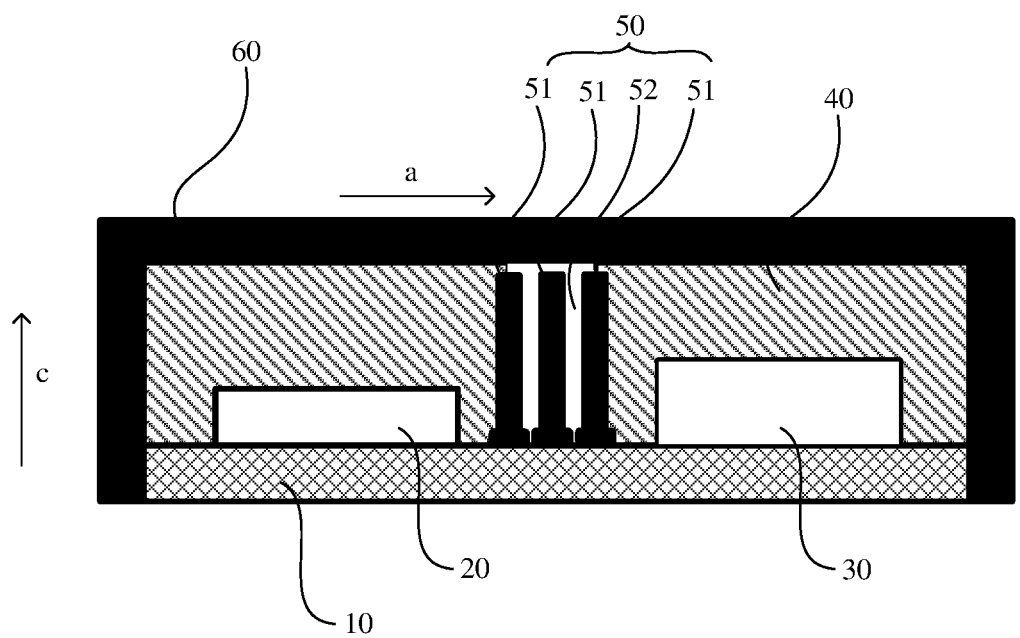
FIG. 8a is an example cross-sectional view of a packaging module according to an embodiment of this application.
Figure 8B:
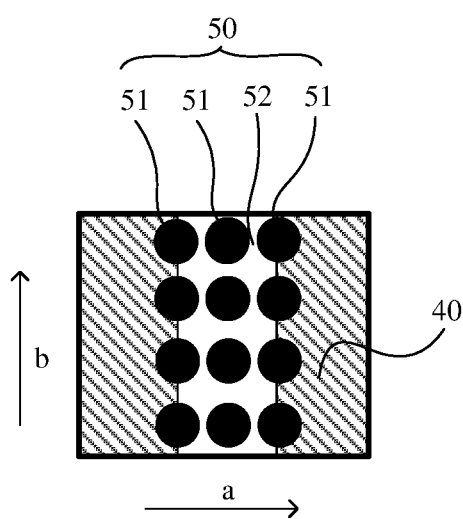
FIG. 8b is an example top view of a partition structure of a packaging module according to an embodiment of this application.

FIG. 8a is a deformed structure of a system in a package according to an embodiment of this application, and FIG. 8b is a top view of a partition structure 50. For some reference signs in FIG. 8a and FIG. 8b, references may be made to the same reference signs in FIG. 2a and FIG. 2b. In the partition structure 50 shown in FIG. 9a and FIG. 9b, a plurality of conductive pillars 51 are arranged into three rows, each row of conductive pillars 51 are arranged in the direction b, and the three rows of conductive pillars 51 are arranged in the direction a. Among the three rows of conductive pillars 51, a gap is formed between two adjacent conductive pillars 51 in the direction a, and a gap is also formed between two adjacent conductive pillars 51 in the direction b. In an optional solution, the conductive pillars 51 in the three rows of conductive pillars 51 are aligned one by one, that is, three conductive pillars 51 are arranged in a row in the direction a, and the plurality of conductive pillars 51 are arranged in a matrix. When a groove is provided, a part of a side wall of a conductive pillar at an outermost layer of the plurality of conductive pillars 51 is exposed in the groove; and a side wall of a conductive pillar 51 at the middle is exposed in the groove. When conductive adhesive 52 is filled, the conductive adhesive 52 wraps the part of the side wall of the conductive pillar 51 at the outermost layer and exposed in the groove. It can be learned from FIG. 8a and FIG. 8b that in the partition structure 50 provided in this embodiment of this application, a plurality of rows of conductive pillars 51 may alternatively be used, and an effect of isolating the first device group 20 from the second device group 30 can also be achieved.

Figure 9A:
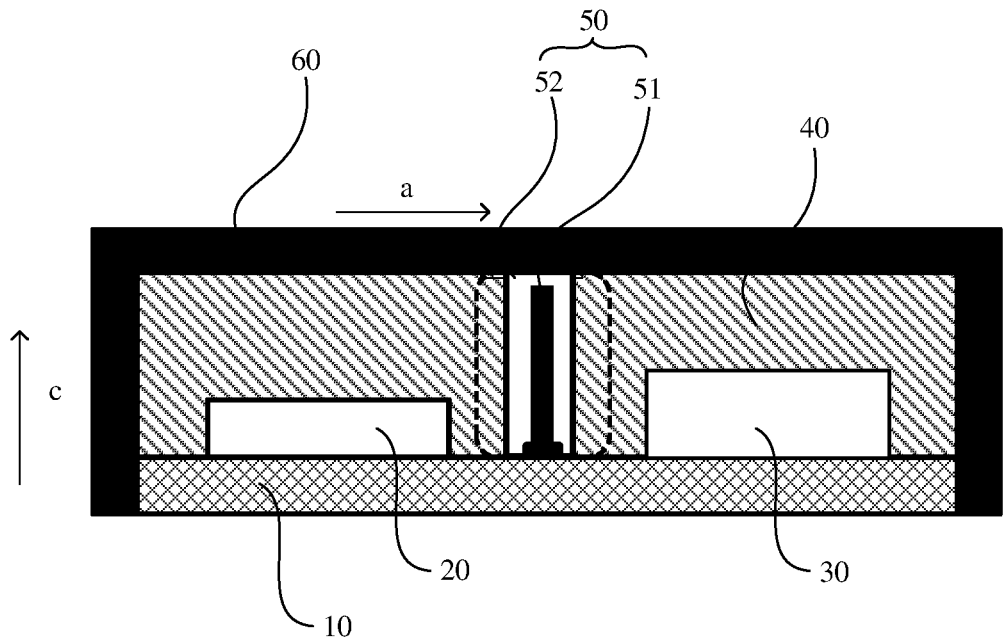
FIG. 9a is an example cross-sectional view of a packaging module according to an embodiment of this application.
Figure 9B:
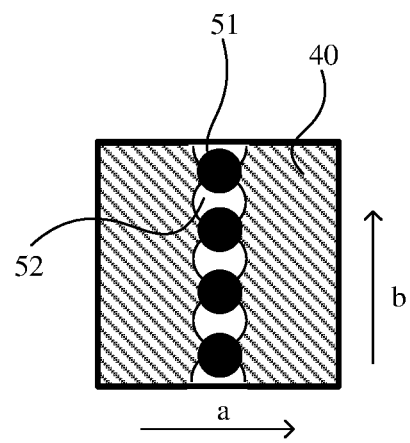
FIG. 9b is an example top view of a partition structure of a packaging module according to an embodiment of this application.

FIG. 9a is a deformed structure of a system in a package according to an embodiment of this application, and FIG. 9b is a top view of a partition structure 50. For some reference signs in FIG. 9a and FIG. 9b, references may be made to the same reference signs in FIG. 2a and FIG. 2b. In the partition structure 50 shown in FIG. 9a and FIG. 9b, a plurality of conductive pillars 51 are arranged into a single row As shown in FIG. 9b, the plurality of conductive pillars 51 are arranged into a single row in the direction b. In the direction b, there is a gap between adjacent conductive pillars 51. Conductive adhesive 52 fills the gap, and the conductive adhesive 52 and the plurality of conductive pillar 51 are staggered, so that the plurality of conductive pillars 51 are electrically connected together. When the conductive adhesive 52 is disposed specifically, a mold compound 40 is provided with a plurality of filling holes, and each filling hole is provided between any two adjacent conductive pillars 51. As shown in FIG. 9b, the plurality of filling holes are arranged in the direction b, and the filling holes and the conductive pillars 51 are staggered. Each conductive pillar 51 corresponds to at least one filling hole, and a part of a side wall of each conductive pillar 51 is exposed in a corresponding filling hole. When the conductive adhesive 52 is filled, the conductive adhesive 52 fills each filling hole, and the conductive adhesive 52 wraps the part of the side wall of each conductive pillar 51 exposed in the corresponding filling hole. That is, the conductive adhesive 52 in each filling hole wraps the part of the side wall of the conductive pillar 51 exposed in the filling hole. It can be learned from a structure shown in FIG. 9b that the partition structure 50 of which a length direction is along the direction b may also be formed in a manner of staggering the conductive pillars 51 and the conductive adhesive 52, to isolate the first device group 20 from the second device group 30.

In an optional solution, a diameter of the filling hole may be greater than or equal to 100 μm and less than or equal to 300 μm. For example, the diameter of the filling hole may be in any size from 100 μm to 300 μm such as 100 μm, 150 μm, 200 μm, 250 μm, or 300 μm. When the hole diameter is used, an electrical connection between the conductive pillars 51 can be ensured, a resistance of the formed partition structure 50 can be reduced, and the amount of the conductive adhesive 52 can also be reduced as much as possible.

When the foregoing structure is used, a corresponding preparation method is similar to the preparation method corresponding to FIG. 2a and FIG. 2b. The only difference lies in the step of filling a gap between the conductive pillars 51 with the conductive adhesive 52 and electrically connecting the conductive adhesive and the conductive pillars 51. When the filling hole structure is used, the step may be that: a mold compound 40 is disposed to wrap the first device group 20, the second device group 30, and the plurality of conductive pillars 51. For a specific solution, references may be made to the related description in FIG. 4d. One filling hole is provided between every two adjacent conductive pillars 51, a part of a side wall of each conductive pillar 51 is wrapped by the mold compound, and a part of the side wall is exposed in a corresponding filling hole. For a hole opening process, references may be made to a groove opening process. The conductive adhesive 52 fills the filling hole, and the conductive adhesive 52 wraps the part of the side wall of each conductive pillar 51 exposed in the corresponding filling hole. For a material and a filling process of the conductive adhesive 52, references may be made to the related description in FIG. 4e.

It can be learned from FIG. 2b, FIG. 5b, FIG. 6b, FIG. 7b, and FIG. 8b that the plurality of conductive pillars 51 provided in the embodiments of this application may be arranged into a plurality of rows, and a direction of each row is the length direction of the partition structure. The conductive adhesive 52 fills between two adjacent rows of conductive pillars 51, and a part of a side wall of the conductive pillar 51 is wrapped by using the conductive adhesive 52, so that the plurality of conductive pillars 51 can be electrically connected together, to form the partition structure 50. Certainly, the conductive pillars 51 may be alternatively arranged into a single row. As shown in FIG. 9b, the plurality of conductive pillars 51 can also be electrically connected together, to form the partition structure 50. It should be understood that in several partition structures 50 of the above examples, all the partition structures 50 are arranged in a straight line. However, the partition structure 50 used in this embodiment of this application is not limited to the foregoing straight line type, and another manner may be alternatively used. The partition structure 50 may be applied in this embodiment of this application provided that the partition structure 50 is formed in a manner in which the conductive pillar 51 and the conductive adhesive 52 are mixed together. For example, different shapes such as an S shape, an arc shape, and a wave shape may alternatively be used for the partition structure 50. When the partition structure 50 is in different shapes, a corresponding arrangement manner of the conductive pillars 51 and a filling manner of the conductive adhesive 52 may be adapted to the shape of the partition structure 50.

When there are a plurality of device groups, there may also be a plurality of partition structures 50, and an arrangement manner of the partition structures 50 corresponds to an arrangement manner of the device groups. For example, when the plurality of device groups are arranged in an array, the partition structures 50 may also form a grid, and each grid can correspondingly accommodate one device group. Each grid may be enclosed by different quantities of partition structures 50 such as three, four, or five. When the plurality of device groups are arranged in a single row, there may also be a plurality of partition structures 50, the plurality of partition structures 50 are arranged in parallel, and a space for accommodating a device group is isolated between two adjacent partition structures 50.

An embodiment of this application further provides an electronic device, and the electronic device is an electronic device having a communication function such as a compact portable electronic device such as a smartphone, a smartwatch, or a wireless router. These electronic devices include devices such as radio frequency transceiver circuits related to Wi-Fi, Bluetooth, and cellular signals that are susceptible to radio frequency interference; and other devices requiring clock signals such as a processor and a memory.

Figure 10:
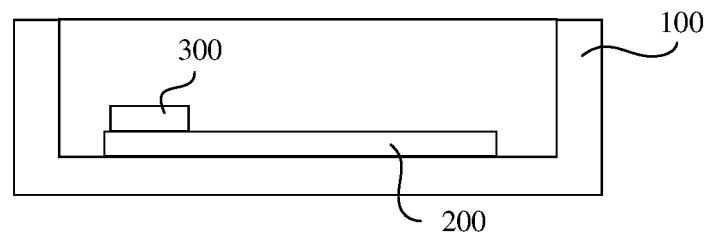
FIG. 10 is an example schematic diagram of a structure of a smartwatch according to an embodiment of this application.

The electronic device provided in this embodiment of this application includes a circuit board and the packaging module according to any one of the foregoing, the packaging module is fixed to the circuit board, and the circuit board is electrically connected to a substrate. A smartwatch shown in FIG. 10 is used as an example. The smartwatch includes a housing 100, a circuit board 200 disposed in the housing 100, and further includes a packaging module 300 disposed on the circuit board 200. The circuit board 200 is electrically connected to a substrate of the packaging module 300, to implement a function of a device in the substrate. Optionally, the circuit board 200 may be further used as the substrate of the packaging module 300, thereby simplifying a structure in the electronic device. With the structure, a conductive pillar and conductive adhesive form a partition structure. On one hand, when the conductive pillar is used as a part of the partition structure, a conductivity of the conductive pillar is greater than that of the conductive adhesive, to improve a conductivity of the partition structure. On the other hand, when the conductive pillar is used as a part of the partition structure, an amount of the conductive adhesive can be reduced, and costs of the entire shielding structure can be reduced, thereby reducing costs of the entire electronic device.

A person skilled in the art can make various modifications and variations to this application without departing from the spirit and scope of this application. This application is intended to cover these modifications and variations of this application provided that the modifications and variations fall within the scope of protection defined by the following claims and their equivalent technologies.

What is claimed is:

1. A packaging module, comprising:
   a substrate;
   at least two device groups disposed on the substrate; and
   a shielding structure configured to shield the at least two device groups, wherein
      the shielding structure comprises a partition structure configured to perform electromagnetic isolation between every two adjacent device groups of the at least two device groups,
      the partition structure comprises a plurality of conductive pillars and conductive adhesive,
      the plurality of conductive pillars are electrically connected to a ground layer of the substrate,
      the plurality of conductive pillars are arranged at intervals,
      the conductive adhesive fills a gap between every adjacent conductive pillar, of the plurality of conductive pillars,
      the conductive adhesive electrically connects adjacent conductive pillars, of the plurality of conductive pillars,
      a conductivity of a conductive pillar, of the plurality of conductive pillars, is greater than the conductivity of the conductive adhesive, and
      the shielding structure further comprises:
         a shielding mask facing at least a part of a surface of the substrate, wherein
      the shielding mask is electrically connected to the ground layer of the substrate,
      the at least two device groups are located in a space enclosed by the shielding mask and the substrate,
      the conductive adhesive is electrically connected to the shielding mask,
      a gap is formed between the conductive pillar and the shielding mask,
      the conductive adhesive fills the gap between the shielding mask and the conductive pillar, of the plurality of conductive pillars, and
      a top end of the conductive pillar is not directly electrically connected to the shielding mask.

2. The packaging module according to claim 1, wherein the conductive pillar, of the plurality of conductive pillars, is in contact with an inner wall of the shielding mask.

3. The packaging module according to claim 2, wherein when a gap is formed between the conductive pillar, of the plurality of conductive pillars, and the shielding mask, the gap is less than or equal to 300 µm.

4. The packaging module according to claim 1, wherein
   the plurality of conductive pillars are arranged into a plurality of rows, and a direction of the plurality of rows includes a length direction of the partition structure,
   the packaging module further comprises a mold compound, the at least two device groups are all packaged in the mold compound, and a part of a side wall of each conductive pillar, of the plurality of conductive pillars, is wrapped by the mold compound,
   a first groove is provided between two adjacent rows of conductive pillars, and a part of the side wall of each conductive pillar is exposed in the first groove, and
   the conductive adhesive fills the first groove, and wraps the part of the side wall of each conductive pillar exposed in the first groove.

5. The packaging module according to claim 1, wherein
   the plurality of conductive pillars are arranged into a plurality of rows, and a direction of the plurality of rows includes a length direction of the partition structure,
   the packaging module further comprises a mold compound, the at least two device groups are all packaged in the mold compound, and a part of a side wall of each conductive pillar, of the plurality of conductive pillars, is wrapped by the mold compound,
   a first filling hole is provided among every four adjacent conductive pillars, and a part of the side wall of each conductive pillar is exposed in a corresponding filling hole, and
   the conductive adhesive fills each filling hole, and the conductive adhesive wraps the part of the side wall of each conductive pillar exposed in the corresponding filling hole.

6. The packaging module according to claim 1, wherein
   the packaging module further comprises a mold compound, the at least two device groups are packaged in the mold compound, and a part of a side wall of each conductive pillar, of the plurality of conductive pillars, is wrapped by the mold compound,
   a first filling hole is provided between every two adjacent conductive pillars, and a part of the side wall of each conductive pillar is exposed in a corresponding filling hole, and
   the conductive adhesive fills each filling hole, and the conductive adhesive wraps the part of the side wall of each conductive pillar exposed in the corresponding filling hole.

7. The packaging module according to claim 1, wherein a ratio of a total volume of the plurality of conductive pillars to a volume of the partition structure is greater than or equal to 10% and less than or equal to 30%.

8. An electronic device, comprising:
   a circuit board; and
   a packaging module, wherein the packaging module is fixed to the circuit board, and the packaging module comprises:
   a substrate;

a plurality of device groups including, at least, first and second device groups disposed on the substrate; and a shielding structure configured to shield the first and second device groups, wherein the shielding structure comprises a partition structure configured to perform electromagnetic isolation between every two adjacent device groups of the plurality of device groups, the partition structure comprises a plurality of conductive pillars and conductive adhesive, the plurality of conductive pillars are electrically connected to a ground layer of the substrate, the plurality of conductive pillars are arranged at intervals into at least one row in a length direction of the partition structure, the conductive adhesive fills a gap between every adjacent conductive pillar, of the plurality of conductive pillars, the conductive adhesive electrically connects adjacent conductive pillars, of the plurality of conductive pillars, and a conductivity of a conductive pillar, of the plurality of conductive pillars, is greater than the conductivity of the conductive adhesive.

9. The electronic device of claim 8, wherein the packaging module further comprises a mold compound, the at least two device groups are packaged in the mold compound, and a part of a side wall of each conductive pillar, of the plurality of conductive pillars, is wrapped by the mold compound, a first filling hole is provided between every two adjacent conductive pillars, and a part of the side wall of each conductive pillar is exposed in a corresponding filling hole, and the conductive adhesive fills each filling hole, and the conductive adhesive wraps the part of the side wall of each conductive pillar exposed in the corresponding filling hole.

10. The electronic device of claim 8, wherein a ratio of a total volume of the plurality of conductive pillars to a volume of the partition structure is greater than or equal to 10% and less than or equal to 30%.

11. The electronic device of claim 8, wherein the shielding structure further comprises a shielding mask facing at least a part of a surface of the substrate, the shielding mask is electrically connected to the ground layer of the substrate, the at least two device groups are located in a space enclosed by the shielding mask and the substrate, and the conductive adhesive is electrically connected to the shielding mask.

12. The electronic device of claim 11, wherein the conductive pillar, of the plurality of conductive pillars, is in contact with an inner wall of the shielding mask.

13. The electronic device of claim 12, wherein when a gap is formed between the conductive pillar, of the plurality of conductive pillars, and the shielding mask, the gap is less than or equal to 300 μm.

14. The electronic device of claim 11, wherein a gap is formed between the conductive pillar, of the plurality of conductive pillars, and the shielding mask, and the conductive adhesive fills the gap between the shielding mask and the conductive pillar, of the plurality of conductive pillars.

15. The electronic device of claim 11, wherein a top end of the conductive pillar is not directly electrically connected to the shielding mask.

16. A method for preparing a packaging module, comprising:

disposing at least two device groups on a substrate;

disposing a plurality of conductive pillars included in a partition structure of a shielding structure, electrically connected to a ground layer of the substrate, on the substrate, wherein the plurality of conductive pillars are arranged at intervals into at least one row in a length direction of the partition structure, and the plurality of conductive pillars perform isolation between every two adjacent device groups of the at least two device groups;

filling a gap between the plurality of conductive pillars with conductive adhesive, and electrically connecting adjacent conductive pillars, of the plurality of conductive pillars; and performing electromagnetic isolation between every two adjacent device groups by using a conductive pillar, of the plurality of conductive pillars, and the conductive adhesive.

17. The method for preparing the packaging module according to claim 16, wherein disposing the plurality of conductive pillars, electrically connected to the ground layer of the substrate, on the substrate, comprises:

arranging the plurality of conductive pillars into a plurality of rows;

arranging a mold compound to wrap the at least two device groups and the plurality of conductive pillars;

providing a first groove between two adjacent rows of conductive pillars, wherein a part of a side wall of each conductive pillar, of the plurality of conductive pillars, is wrapped by the mold compound, and a part of the side wall is exposed in the first groove; and filling the first groove with the conductive adhesive, wherein the conductive adhesive wraps the part of the side wall of each conductive pillar exposed in the first groove.

18. The method for preparing the packaging module according to claim 16, wherein disposing the plurality of conductive pillars, electrically connected to the ground layer of the substrate, on the substrate comprises:

arranging the plurality of conductive pillars into a plurality of rows;

arranging a mold compound to wrap the at least two device groups and the plurality of conductive pillars;

providing a first filling hole among every four adjacent conductive pillars, wherein a part of a side wall of each conductive pillar, of the plurality of conductive pillars, is wrapped by the mold compound, and a part of the side wall is exposed in a corresponding filling hole; and filling the first filling hole with the conductive adhesive, wherein the conductive adhesive wraps the part of the side wall of each conductive pillar exposed in the corresponding filling hole.

19. The method for preparing the packaging module according to claim 16, wherein disposing the plurality of conductive pillars, electrically connected to the ground layer of the substrate, on the substrate comprises:

arranging a mold compound to wrap the at least two device groups and the plurality of conductive pillars;

providing a first filling hole between every two adjacent conductive pillars, wherein a part of a side wall of each conductive pillar, of the plurality of conductive pillars, is wrapped by the mold compound, and a part of the side wall is exposed in a corresponding filling hole; and filling the first filling hole with the conductive adhesive, wherein the conductive adhesive wraps the part of the side wall of each conductive pillar exposed in the corresponding filling hole.

20. The method for preparing the packaging module according to claim 16, wherein a ratio of a total volume of the plurality of conductive pillars to a volume of the partition structure is greater than or equal to 10% and less than or equal to 30%.

* * * * *